(12) United States Patent
Yamaguchi

(10) Patent No.: US 7,256,145 B2
(45) Date of Patent: Aug. 14, 2007

(54) MANUFACTURE OF SEMICONDUCTOR DEVICE HAVING INSULATION FILM OF HIGH DIELECTRIC CONSTANT

(75) Inventor: Masaomi Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/050,832

(22) Filed: Jan. 27, 2005

(65) Prior Publication Data

US 2005/0136658 A1 Jun. 23, 2005

Related U.S. Application Data

(63) Continuation of application No. PCT/JP03/03040, filed on Mar. 13, 2003.

(51) Int. Cl.
*H01L 21/31* (2006.01)
(52) U.S. Cl. ............... 438/785; 257/E21.565
(58) Field of Classification Search ........... 438/200, 438/243, 240
See application file for complete search history.

(56) References Cited

U.S. PATENT DOCUMENTS

| 6,060,755 | A | 5/2000 | Ma et al. | |
| 6,207,589 | B1 * | 3/2001 | Ma et al. | 438/785 |
| 6,844,234 | B2 * | 1/2005 | Eguchi et al. | 438/287 |
| 6,927,112 | B2 * | 8/2005 | Igeta et al. | 438/200 |
| 6,933,249 | B2 | 8/2005 | Yokoyama et al. | |

2002/0001906 A1 1/2002 Park

FOREIGN PATENT DOCUMENTS

| JP | 2001-77111 | 3/2001 |
| JP | 2001-274378 | 10/2001 |
| JP | 2002-026319 | 1/2002 |
| JP | 2002-57155 | 2/2002 |
| JP | 2002-151502 | 5/2002 |
| JP | 2002-246388 | 8/2002 |
| JP | 2002-261097 | 9/2002 |
| JP | 2002-299607 | 10/2002 |
| JP | 2002-367990 | 12/2002 |
| JP | 2003-8011 | 1/2003 |
| JP | 2003-017686 | 1/2003 |

OTHER PUBLICATIONS

Office Action dated Apr. 13, 2007 issued in corresponding Japan Application No. 2004-569357.

* cited by examiner

*Primary Examiner*—Scott B. Geyer
*Assistant Examiner*—Elias Ullah
(74) *Attorney, Agent, or Firm*—Westerman, Hattori, Daniels & Adrian, LLP.

(57) ABSTRACT

Disclosed is a method of manufacturing a semiconductor device which can form, as a gate insulation film, an oxide film of $Hf_{1-x}Al_x$ ($0<x<0.3$) having a small shift in flat band voltage. The method comprises the steps of (a) heating a silicon substrate in a reaction chamber; and (b) supplying film-forming gas containing source gas, which contains metal compound of Hf and metal compound of Al in carrier gas, and hydrogen gas to a surface of the heated silicon substrate, and depositing on the silicon substrate an HfAlO film as a high-dielectric-constant insulation film having a higher specific dielectric constant than that of silicon oxide, by thermal CVD.

21 Claims, 6 Drawing Sheets

Hf(Otert-C4H9)4

Al[(tert-C4H9)3]

FIG.4

| GROWTH RUN | 1 | 2 | 3 |
|---|---|---|---|
| OXYGEN | 100sccm | 100sccm | 0sccm |
| HYDROGEN | 0sccm | 300sccm | 300sccm |
| PHYSICAL THICKNESS (nm) | 3 | 3 | 3 |
| CET (nm) | 1.6 | 1.6 | 1.6 |
| $\Delta Vfb$ | 0.422(V) | 0.390(V) | 0.295(V) |

US 7,256,145 B2

MANUFACTURE OF SEMICONDUCTOR DEVICE HAVING INSULATION FILM OF HIGH DIELECTRIC CONSTANT

CROSS REFERENCE TO RELATED APPLICATION

This application is a continuation application of International patent application No. PCT/JP03/03040, filed on Mar. 13, 2003, the entire contents of which are incorporated herein by reference.

BACKGROUND OF THE INVENTION

A) Field of the Invention

The present invention relates to a semiconductor device and a method of manufacturing a semiconductor device, and, more particularly, to a semiconductor device having an insulation film of a high dielectric constant and a method of manufacturing the semiconductor device.

B) Description of the Related Art

Insulated gate (IG) field effect transistors (FETs), typical examples of which are MOS transistors, are widely used as typical semiconductor devices used in a semiconductor integrated circuit device. For a larger scale integration of semiconductor integrated circuit devices, IG-FETs have been miniaturized according the scaling law. Miniaturization can reduce the sizes of IG-FETs, such as making the gate insulation film thinner and shortening the gate length, and improve the performances of miniaturized devices while keeping the normal performances.

The gate insulation films of MOS transistors of the next generation should be made as thin as 2 nm or less. With that film thickness, the tunnel current starts flowing, the gate leak current becomes uncontrollable, and an increase in power dissipation cannot be avoided. To suppress the tunnel current which flows through the gate insulation film, the gate insulation film in use should be thick.

To increase the physical thickness of the gate insulation film while keeping the effective thickness of the gate insulation film equivalent to a silicon oxide film, the use of a high-dielectric-constant insulation material having a specific dielectric constant higher than that of a silicon oxide for the gate insulation film has been proposed. The specific dielectric constant of the silicon oxide is said to be, for example, approximately 3.5 to 4.5, depending on the deposition method. The specific dielectric constant of a silicon nitride is higher than that of the silicon oxide, and is said to be approximately 7 to 8.

Japanese Patent Laid-Open Publication No. 2001-274378 proposes the use of barium titanate (Ba(Sr)TiO$_3$), titanium oxide (TiO$_2$), tantalum oxide (Ta$_2$O$_5$), zirconium oxide (ZrO$_2$), hafnium oxide (HfO$_2$), silicon nitride (Si$_3$N$_4$), or alumina (Al$_2$O$_3$), which has a specific dielectric constant higher than that of silicon oxide, for a gate insulation film. The publication also proposes a structure where a silicon oxide film is intervened between such a high-dielectric-constant insulation film and a silicon substrate.

The use of a new material having a high specific dielectric constant for the gate insulation film of an IG-FET brings about a new problem. Solving such a new problem is desired to promote the practical use of new materials.

SUMMARY OF THE INVENTION

An object of the invention is to provide a semiconductor device having a gate insulation film for which a high-dielectric-constant insulation material having a specific dielectric constant higher than that of a silicon oxide is used.

Another object of the invention is to provide a manufacture method for a semiconductor device, which can form a gate insulation film of a high-dielectric-constant insulation material having a specific dielectric constant higher than that of silicon oxide.

A further object of the invention is to provide a semiconductor device which uses an oxide film of Hf$_{1-x}$Al$_x$ (0<x<0.3) with a suppressed change in flat band voltage as a gate insulation film.

A yet further object of the invention is to provide a manufacture method for a semiconductor device which can form an oxide film of Hf$_{1-x}$Al$_x$ (0<x<0.3) with a suppressed change in flat band voltage as a gate insulation film.

In this specification, the term "film-forming gas" is used to mean positive composition gas used for deposition, excluding inert carrier gas.

According to one aspect of the invention, there is provided a method of manufacturing a semiconductor device comprising the steps of: (a) heating a silicon substrate in a reaction chamber; and (b) supplying film-forming gas containing source gas, which contains metal compound of Hf and metal compound of Al in carrier gas, and hydrogen gas to a surface of the heated silicon substrate, and depositing on the silicon substrate an HfAlO film as a high-dielectric-constant insulation film having a higher specific dielectric constant than that of silicon oxide, by thermal CVD.

According to another aspect of the invention, there is provided a method of manufacturing a semiconductor device comprising the steps of: (a) heating a silicon substrate in a reaction chamber; and (b) supplying film-forming gas containing source gas, which contains metal compound of Hf and metal compound of Al in carrier gas, and hydrogen gas to a surface of the heated silicon substrate, and depositing on the silicon substrate an HfAlO film as a high-dielectric-constant insulation film having a higher specific dielectric constant than that of silicon nitride, by thermal CVD.

According to a further aspect of the invention, there is provided a semiconductor device comprising: a silicon substrate having an active region; a gate insulation film formed on a surface of the active region of the silicon substrate, and including a high-dielectric-constant insulation film essentially consisting of oxide of Hf$_{1-x}$Al$_x$ (0<x<0.3), which has flat band voltage shift of 0.3 V or smaller; a gate electrode formed on the gate insulation film and including an impurity-doped silicon layer; and source/drain regions formed on both sides of the gate electrode by doping impurity in the active region of the silicon substrate.

The present inventor discovered that when hydrogen was added to film-forming gas at the time of depositing a high-dielectric-constant insulation film having a specific dielectric constant higher than that of silicon oxide or silicon nitride, flat band voltage shift was reduced. The flat band voltage is said to be shifted according to the amount of fixed charges in the film. It is considered that the reduced shift in flat band voltage is ascribed to a reduction in the amount of fixed charges in the film, that is caused by the addition of hydrogen to the film-forming gas.

BRIEF DESCRIPTION OF THE DRAWINGS

FIG. 4 is a table showing the results of the experiment; and

DESCRIPTION OF THE PREFERRED EMBODIMENTS

Hafnium oxide is an insulator which can provide a specific dielectric constant several to ten and several times as large as the specific dielectric constant of silicon oxide, and has a high potential as the gate insulation film of an IG-FET. Hafnium oxide (hafnia) is easily crystallized, and it is not easy to form a dense film of a thin and uniform thickness. When a gate insulation film is made of hafnium oxide only on a silicon substrate, a crystalline insulation film with a large leak current is likely to ge formed.

The crystallization can be suppressed by mixing aluminum oxide (alumina) ($Al_2O_3$) in the hafnium oxide ($HfO_2$). The suppressed crystallization reduces the leak current. The aluminum oxide has a specific dielectric constant lower than that of the hafnium oxide. To acquire a specific dielectric constant as high as possible, it is preferable that the amount of the aluminum oxide to be mixed in the hafnium oxide should be limited to $Hf_{1-x}Al_xO(0<x<0.3)$. For suppression of crystallization, $Hf_{1-x}Al_xO(0.1<x<0.3)$ is desirable.

Such a high-dielectric-constant insulation film having a high specific dielectric constant cannot be formed by thermal oxidization of a silicon substrate. Thermal chemical vapor deposition (CVD) is known as a processcapable of forming a high-quality high-dielectric-constant insulation film without adversely affecting the substrate.

As an HfAlO film is formed by thermal CVD, the flat band voltage is shifted from the value (ideal value) that is obtainable from the solid state characteristics of the material itself. Shift in flat band voltage is considered to be due to the fixed charges in the film. Presence of dangling bonds in the film, for example, may be a cause of fixed charges. As the number of dangling bonds in the film is reduced, the amount of fixed charges is condidered to be reduced. The following description will be made on the experiment conducted by the present inventor.

Figure 1A:
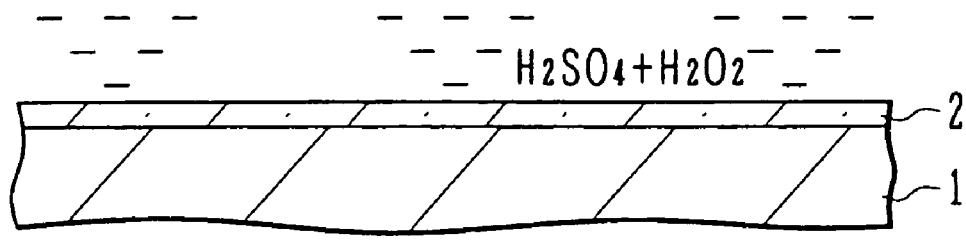
FIGS. 1A to 1G are cross-sectional views for illustrating a method of forming a high-dielectric-constant insulation film on a silicon substrate by CVD.

As shown in FIG. 1A, the surface of a silicon substrate 1 was cleaned with $H_2SO_4+H_2O_2$ with a composition of $H_2SO_4:H_2O_2=60:1$. A natural oxide film 2 is formed on the surface of the silicon substrate 1. Contaminant adhered on the surface of the natural oxide film 2 is cleaned.

Figure 1B:
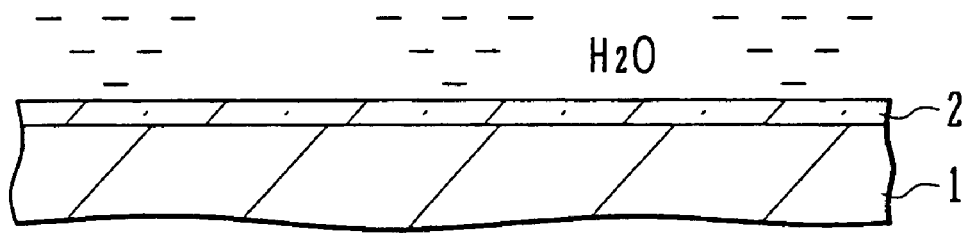

As shown in FIG. 1B, the silicon substrate 1 was rinsed in flowing pure water for ten minutes. The residual after the cleaning with $H_2SO_4+H_2O_2$ is rinsed out with pure water.

Figure 1C:
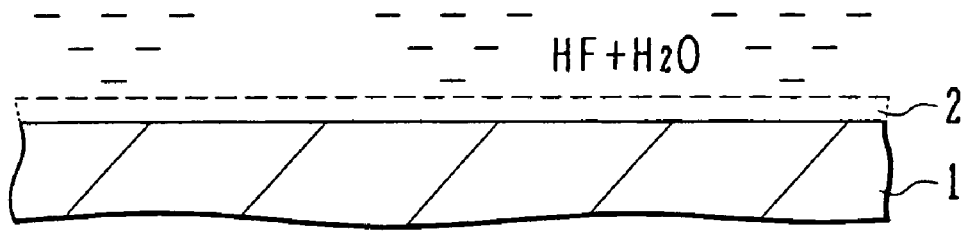

As shown in FIG. 1C, the silicon substrate 1 was dipped in dilute Hf aqueous solution of $HF:H_2O=1:20$ for about one minute to remove the natural oxide film 2 off the surface of the silicon substrate 1.

Figure 1D:

As shown in FIG. 1D, the silicon substrate 1 was rinsed in flowing pure water for ten minutes. The residual after the step of removing the oxide film with $HF+H_2O_2$ is rinsed out with pure water.

Figure 1E:
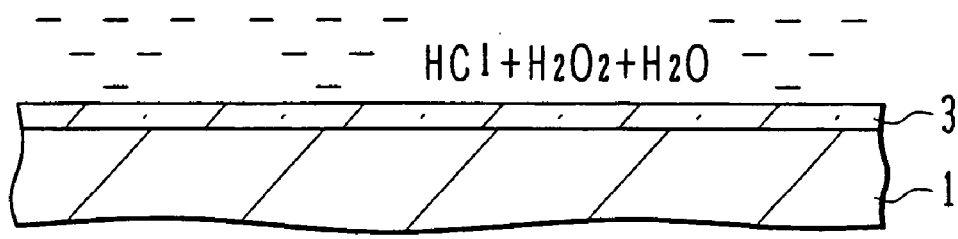

As shown in FIG. 1E, the silicon substrate was cleaned with SC2 ($HCl:H_2O_2:H_2O=1:1:5$), forming a chemical oxide film 3 on the silicon surface. A silicon oxide film 3 cleaner than the natural oxide film 2 is formed.

Figure 1F:
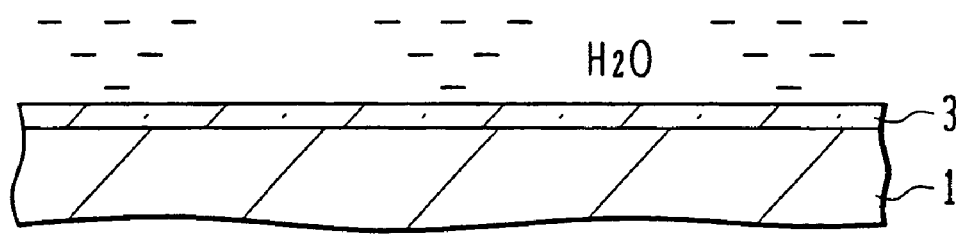

As shown in FIG. 1F, the silicon substrate 1 was rinsed in flowing pure water for ten minutes. The residual after the step of forming the oxide film with SC2 is rinsed out with pure water. Next, the substrate surface was dried with hot nitrogen drying. Then, the silicon substrate 1 was loaded into a CVD deposition apparatus.

Figure 1G:
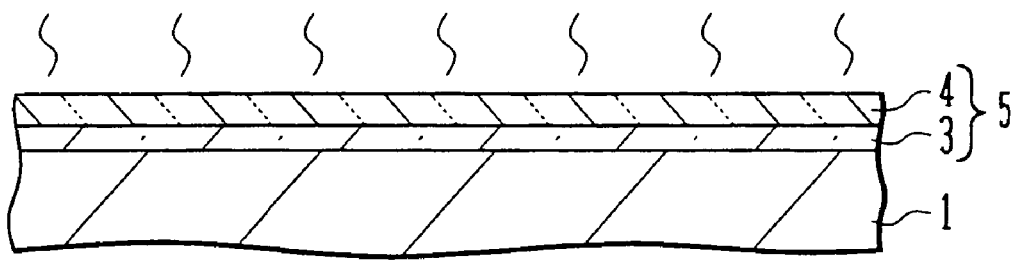

As shown in FIG. 1G, a high-dielectric-constant insulation film 4 of HfAlO was deposited on the chemical oxide film 3 of the silicon substrate 1 by thermal CVD. As HfAlO, $Hf_{0.8}Al_{0.2}$ was formed. The chemical oxide film 3 and the high-dielectric-constant insulation film 4 form a composite insulation film 5. An impurity-doped silicon film may be formed on the insulation film 5 to form an insulated gate electrode.

An HfAlO film having a thickness of about 3 nm was grown on the silicon oxide film 3 having a thickness of about 1 nm, yielding a capacitance equivalent silicon oxide thickness (CET) of 1.6 nm. A gate insulation film having a equivalent silicon oxide thickness (CET) of less than 2 nm can be formed, while forming an HfAlO insulation film of 3 nm or larger in thickness.

Figure 2:
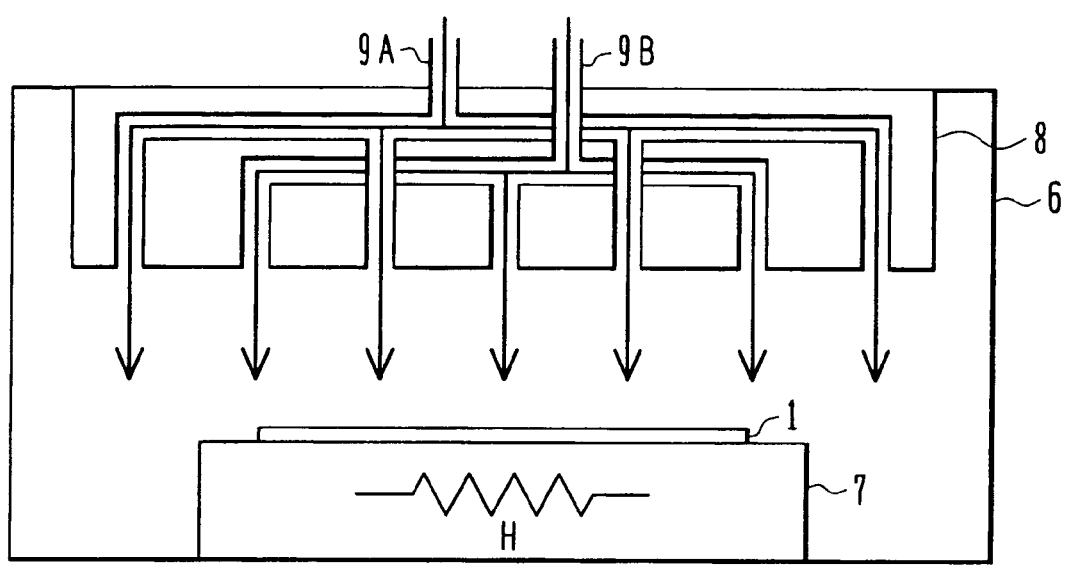
FIG. 2 is a schematic cross-sectional view illustrating the structure of a thermal CVD apparatus.

FIG. 2 schematically shows the structure of the thermal CVD film-forming apparatus. A shower head 8 is disposed in a reaction chamber 6, and a susceptor 7 with a heater H is placed under the shower head 8. The shower head 8 is provided with independent piping lines 9A and 9B through which film-forming gases such as Hf and Al source gases or so are supplied.

Figure 3A:
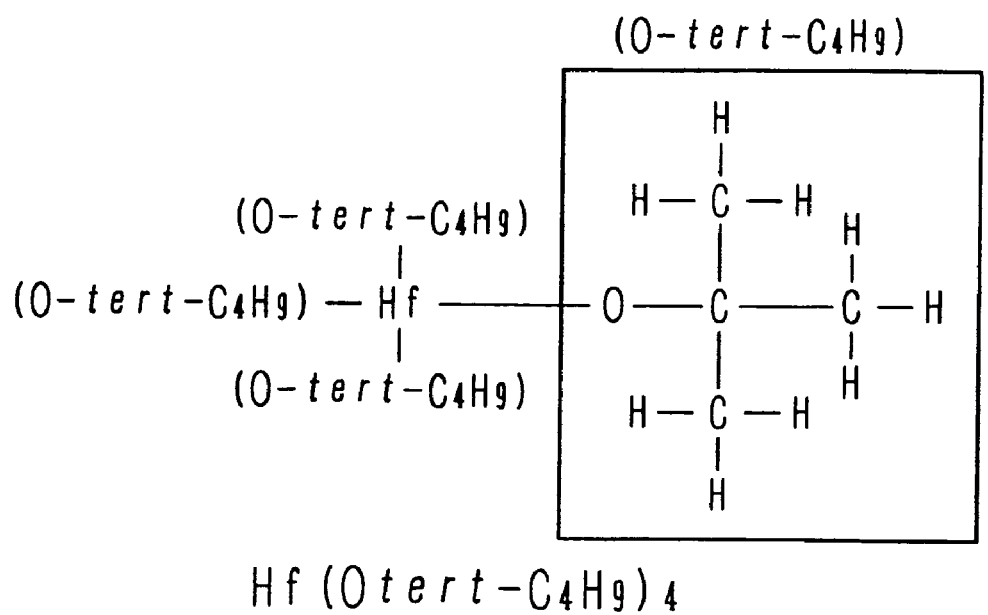
FIGS. 3A and 3B show chemical configuration formulae of an organic Hf source and an organic Al source used in experiment.
Figure 3B:
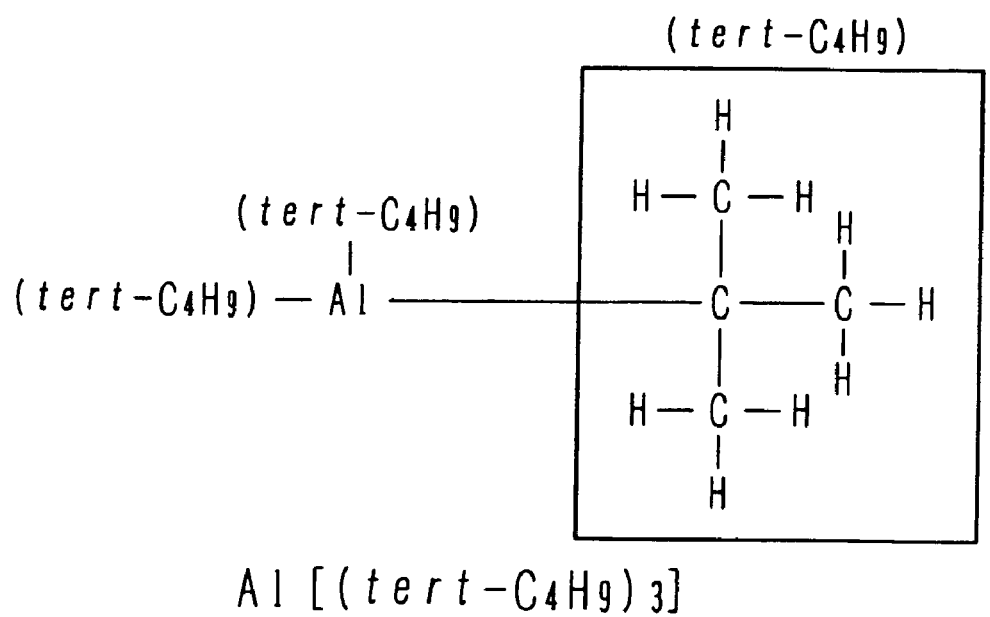

FIGS. 3A and 3B show chemical configuration formulae of $Hf(Ot-C_4H_9)_4$ (tetratertialbutoxyhafnium; TTBHf, used as an organic metal source of $HfO_2$, and $(Al(t-C_4H_9)_3$ (tritertialbutylaluminum; TTBAl), used as an organic metal source of Al.

$O_2$ and $N_2$ were also used as additional film-forming gases. Further, $H_2$ gas was used, expecting function of reducing fixed charges. The temperature of the susceptor 7, and hence the temperature of the silicon substrate 1 during deposition was set to 500° C. The pressure of atmosphere during deposition was set to 65 Pa. The total flow rate of the film-forming gas was set to 1500 sccm.

FIG. 4 shows three types of growths experimented. After a high-dielectric-constant insulation film was grown by thermal CVD, the flat band voltage, Vfb, was checked. The flat band voltage is expressed by a shift $\Delta$Vfb from the ideal value.

In the first growth, $O_2$ of 100 sccm was added to nitrogen gas of 500 sccm bubbled through $Hf(Ot-C_4H_9)_4$ and nitrogen gas of 300 sccm bubbled through $Al(t-C_4H_9)_3$ to provide source gas, which was then supplied from the shower head 8 together with a remaining carrier gas $N_2$ of 600 sccm, and then thermal CVD was performed. TTBHf and TTBAl were thermally decomposed at the surface of the substrate, so that Hf and Al contained in the source gas are bonded with oxygen to form $HfO_2$ and $Al_2O_3$, thereby forming $Hf_{0.8}Al_{0.2}O$. This is a reference example equivalent to the deposition discussed in the DESCRIPTION OF THE RELATED ART.

An $Hf_{0.8}Al_{0.2}O$ film with a thickness of 3 nm was formed, and capacitance equivalent silicon oxide thickness (CET) of 1.6 nm was obtained. Shift of the flat band voltage $\Delta$Vfb was 0.422 V.

In the second growth, $H_2$ of 300 sccm was added to the film-forming gas of the first growth. The flow rate of the carrier gas $N_2$ was reduced to 300 sccm.

An $Hf_{0.8}Al_{0.2}O$ film with a thickness of 3 nm was formed, and a capacitance equivalent silicon oxide thickness (CET) of approximately 1.6 nm was obtained. The shift of the flat band voltage ΔVfb was 0.390 V, smaller than the shift ΔVfb in the first growth. The amount of fixed charges was considered to be reduced.

In the third growth, $O_2$ was removed from the film-forming gas of the second growth. The flow rate of the remaining carrier gas $N_2$ became 400 sccm. The source gas $Hf(Ot-C_4H_9)_4$ contains four O atoms per each Hf atom. There is also a silicon oxide film under the high-dielectric-constant insulation film. There is also a possibility of oxygen being supplied from air in the atmosphere after deposition. It is considered that an oxide film can be deposited even without oxygen in the film-forming gas.

An $Hf_{0.8}Al_{0.2}O$ film with a thickness of 3 nm was formed, and a capacitance equivalent silicon oxide thickness (CET) of approximately 1.6 nm was obtained. The shift of the flat band voltage ΔVfb was 0.295 V, which is further smaller than the shift ΔVfb in the second growth. The amount of fixed charges was considered to be further reduced.

It turned out that the flat band voltage shift can be suppressed to 0.3 V or less. It will be also possible to suppress the flat band voltage shift to 0.3 V or less even when oxygen is supplied in the film-forming gas.

It is not well clarified yet why the amount of fixed charges is reduced. One possibility is that as a high-dielectric-constant insulation film is deposited by thermal CVD, dangling bonds are likely to remain in the film, but the dangling bonds are terminated by hydrogen added, resulting in a reduction in the amount of fixed charges. The carbon contents in the high-dielectric-constant insulation films formed in the second and third growths are smaller than that of the high-dielectric-constant insulation film formed in the reference example. There is a possibility that the reduction in carbon content contribute to the reduction in the fixed charges.

While the hysteresis and the gate leak current were measured, there were large variations in data and a qualitative tendency has not been found out yet. It is expected that further study on the deposition conditions or so can improve the solid state charcteristics more.

The experiment was conducted at the CVD deposition temperature of 500° C. However, the deposition temperature is not limited to 500° C. The HfAlO film would be grown well at a deposition temperature of 400° C. to 600° C.

Although the foregoing description has been given of the case where 20 vol % of hydrogen is added to the film-forming gas, the hydrogen flow rate is not limited to 20 vol %. The amount of hydrogen may be selected from the range of 1 to 30%.

The source gas of Hf is not limited to $Hf(Ot-C_4H_9)_4$. For example, $Hf\{N(CH_3)_2\}_4$, $Hf\{N(C_2H_5)_2\}_4$, $Hf\{N(CH_3)(C_2H_5)\}_4$ or the like may be used as well. Likewise, the source gas of Al is not limited to $Al(t-C_4H_9)_3$. For example, $Al(C_2H_5)_3$, $Al(CH_3)_3$ or the like may also be used.

An increase in atmosphere pressure during deposition showed a tendency of impairing the in-plane distribution of the high-dielectric-constant insulation film. The preferable pressure of atmosphere during deposition would be 10 Pa to 100 Pa.

Although the foregoing description has been given of the case where HfAlO is formed by thermal CVD, shift in flat band voltage would be suppressed by using hydrogen gas, even when other high-dielectric-constant insulation films are grown by thermal CVD. While the source gas is not limited to an organic metal, the use of an organic metal source for the source gas would provide a higher effect.

Figure 5A:
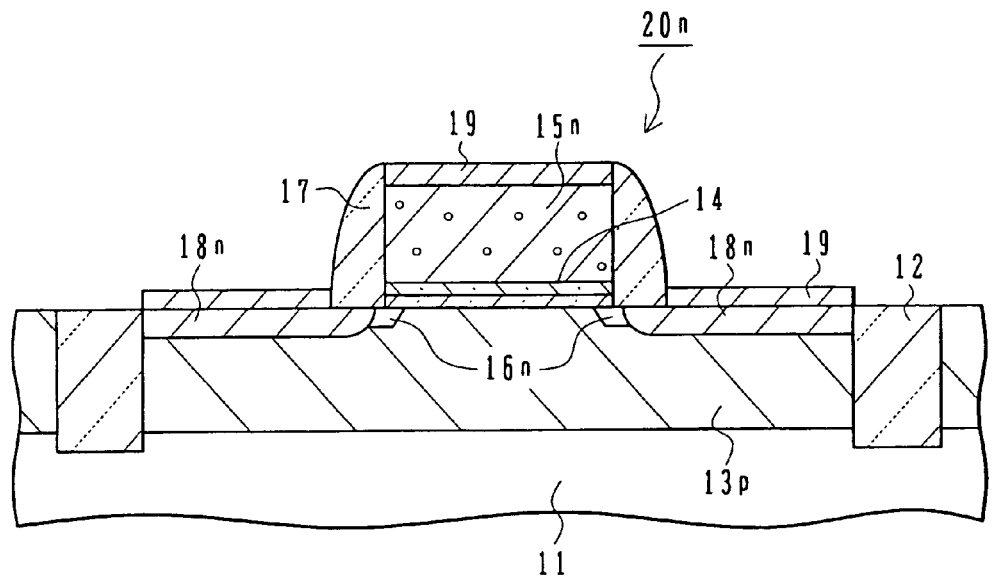
FIGS. 5A and 5B are schematic cross-sectional views illustrating the structures of an IG-FED and a semiconductor device.

FIG. 5A shows the structure of an n-channel IG-FED. An isolation region 12 is formed in a silicon substrate 11 by shallow trench isolation (STI), and a p-type well 13p is formed in an active region. Also, an n-type well or wells are formed in other regions. A gate insulation film 14 is formed on the surface of the active region. The gate insulation film 14 is formed by the lamination of a chemical oxide film and a high-dielectric-constant insulation film grown by CVD using film-forming gas added with $H_2$ gas.

For example, a source gas containing TTBHf, TTBAl and oxygen by a predetermined ratio, and hydrogen gas are supplied to the surface of the silicon substrate on which the chemical oxide film is formed, and an $Hf_{0.8}Al_{0.2}O$ film is formed by thermal CVD. A single-layered high-dielectric-constant insulation film may be formed in place of the lamination of the silicon oxide film and the high-dielectric-constant insulation film.

A gate electrode 15n of n-type polycrystalline silicon doped with phosphorus (P) or arsenic (As) is formed on the gate insulation film 14. An n-type extension region 16n is formed in the surface of the substrate on either side of the gate electrode 15n. Sidewall spacers 17 of a silicon oxide or so are formed on the side walls of the gate electrode 15n, and n-type source/drain regions 18n with a high concentration are formed in the substrate outside the sidewall spacers 17. Silicide layers 19 of CoSi or so are formed on the gate electrode 15n and the source/drain regions 18n. An n-channel IG-FET 20n is fabricated in this manner.

With the structure where the gate insulation film is formed by using a high-dielectric-constant insulation film, the physical film thickness can be increased to suppress the tunnel current even if the equivalent silicon oxide thickness is small. A change in the flat band voltage of the gate insulation film is restrained. It is considered that the amount of fixed charges in the gate insulation film is reduced.

Figure 5B:
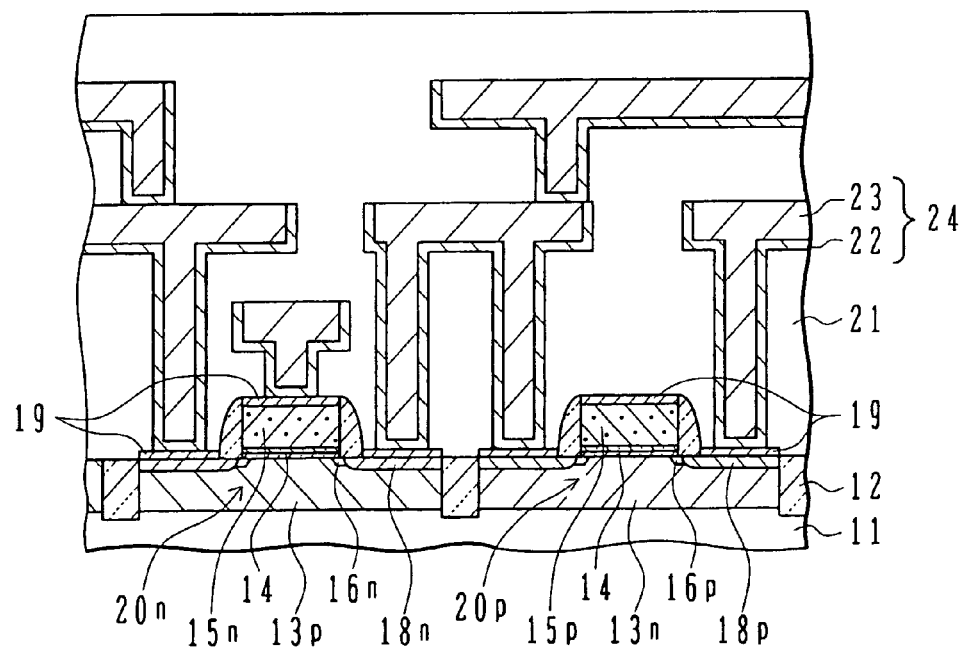

FIG. 5B shows a structure of a semiconductor integrated circuit device. An n-type well 13n and a p-type well 13p are formed in a silicon substrate 11. An n-channel IG-FET 20n is formed in the p-type well 13p. A p-channel IG-FET 20p is formed in the n-type well 13n. The letters "p" and "n" after reference symbols indicate the conductivity types. The p-channel IG-FET 20p has such a structure where the conductivity types of the individual semiconductor regions of the n-channel IG-FET are reversed.

In both the n-channel IG-FET and the p-channel IG-FET, the gate insulation film 14 is formed using a common high-dielectric-constant insulation film of $Hf_{0.8}Al_{0.2}O$ grown by CVD using a hydrogen-containing film-forming gas. The flat band voltage shift ΔVfb of the high-dielectric-constant insulation film is suppressed.

An interlevel insulation film 21 is formed over the gate electrode, and multi-layered wirings 24 are formed in the interlevel insulation film 21. Each of the multi-layered wirings 24 is formed by using a barrier metal layer 22 and a main wiring layer 23 of copper or so.

While the present invention has been described in connection with the embodiment, the invention is not limited thereto. For example, the composition of HfAlO is not limited to $Hf_{0.8}Al_{0.2}O$. Further, another metal oxide may be used as well.

It will be apparent to those skilled in the art that other various modifications, improvements, and combinations can be made.

INDUSTRIAL APPLICABILITY

The invention can be applied to semiconductor integrated circuit devices or so including a miniaturized IG-FET.

I claim:

1. A method of manufacturing a semiconductor device comprising the steps of:
   (a) heating a silicon substrate in a reaction chamber;
   (b) forming a oxide layer; and
   (c) supplying film-forming gas containing source gas, which contains metal compound of Hf and O, and metal compound of Al in carrier gas, and hydrogen gas to a surface of said heated silicon substrate, and depositing on said silicon substrate an HfAlO film as a high-dielectric-constant insulation film having a higher specific dielectric constant than that of silicon oxide, by thermal CVD.

2. The method according to claim 1, wherein said source gas contains organic metal compound of Hf and organic metal compound of Al in said carrier gas.

3. The method according to claim 2, wherein said organic metal compound of Hf is at least one of $Hf(Ot\text{-}C_4H_9)_4$, $Hf\{N(CH_3)_2\}_4$, $Hf\{N(C_2H_5)_2\}_4$ and $Hf\{N(CH_3)(C_2H_5)\}_4$, and said organic metal compound of Al is at least one of $Al(t\text{-}C_4H_9)_3$, $Al(C_2H_5)_3$ and $Al(CH_3)_3$.

4. The method according to claim 1, further comprising the step of forming a chemical oxide layer on said surface of said silicon substrate before said step (a).

5. The method according to claim 1, wherein said silicon substrate has a silicon oxide film with a thickness of approximately 1 nm or less on said surface of said silicon substrate.

6. The method according to claim 1, wherein said silicon substrate is heated to a temperature of 400°C. to 600°C. at said step (a).

7. The method according to claim 1, wherein thermal CVD is performed under a pressure of 10 Pa to 100 Pa at said step (b).

8. A method of manufacturing a semiconductor device comprising the steps of:
   (a) heating a silicon substrate in a reaction chamber;
   (b) forming an oxide layer; and
   (c) supplying film-forming gas containing source gas, which contains metal compound of Hf and O, and metal compound of Al in carrier gas, and hydrogen gas to a surface of said heated silicon substrate, and depositing on said silicon substrate an HfAlO film as a high-dielectric-constant insulation film having a higher specific dielectric constant than that of silicon nitride, by thermal CVD.

9. The method according to claim 8, wherein said source gas contains organic metal compound of Hf and organic metal compound of Al in said carrier gas.

10. The method according to claim 9, wherein said organic metal compound of Hf is at least one of $Hf(Ot\text{-}C_4H_9)_4$, $Hf\{N(CH_3)_2\}_4$, $Hf\{N(C_2H_5)_2\}_4$ and $Hf\{N(CH_3)(C_2H_5)\}_4$, and said organic metal compound of Al is at least one of $Al(t\text{-}C_4H_9)_3$, $Al(C_2H_5)_3$ and $Al(CH_3)_3$.

11. The method according to claim 8, further comprising the step of forming a chemical oxide layer on said surface of said silicon substrate before said step (a).

12. The method according to claim 8, wherein said silicon substrate has a silicon oxide film with a thickness of approximately 1 nm or less on said surface of said silicon substrate.

13. The method according to claim 8, wherein said silicon substrate is heated to a temperature of 400° C. to 600° C. at said step (a).

14. The method according to claim 8, wherein thermal CVD is performed under a pressure of 10 Pa to 100 Pa at said step (b).

15. A method of manufacturing a semiconductor device comprising the steps of:
   (a) heating a silicon substrate in a reaction chamber;
   (b) forming an oxide layer; and
   (c) supplying film-forming gas containing source gas, which contains metal compound of Hf and O, and metal compound of Al in carrier gas, and hydrogen gas to a surface of said heated silicon substrate, and depositing on said silicon substrate an $Hf_{1-x}Al_xO$ film ($0.1<x<0.3$) as a high-dielectric-constant insulation film having a higher specific dielectric constant than that of silicon oxide, by thermal CVD.

16. The method according to claim 15, wherein said source gas contains organic metal compound of Hf and organic metal compound of Al in said carrier gas.

17. The method according to claim 16, wherein said organic metal compound of Hf is at least one of $Hf(Ot\text{-}C_4H_9)_4$, $Hf\{N(CH_3)_2\}_4$, $Hf\{N(C_2H_5)_2\}_4$ and $Hf\{N(CH_3)(C_2H_5)\}_4$, and said organic metal compound of Al is at least one of $Al(t\text{-}C_4H_9)_3$, $Al(C_2H_5)_3$ and $Al(CH_3)_3$.

18. The method according to claim 15, further comprising the step of forming a chemical oxide layer on said surface of said silicon substrate before said step (a).

19. The method according to claim 15, wherein said silicon substrate has a silicon oxide film with a thickness of approximately 1 nm or less on said surface of said silicon substrate.

20. The method according to claim 15, wherein said silicon substrate is heated to a temperature of 400° C. to 600° C. at said step (a).

21. The method according to claim 15, wherein thermal CVD is performed under a pressure of 10 Pa to 100 Pa at said step (b).

* * * * *